United States Patent [19]
Gay et al.

[11] Patent Number: 5,284,795
[45] Date of Patent: Feb. 8, 1994

[54] THERMAL ANNEALING OF SEMICONDUCTOR DEVICES

[75] Inventors: Henri Gay, Fonsegrives; Denis Griot, Tournefeuille; Irenee Pages, Tolosane, all of France

[73] Assignee: Motorola, Inc., Schaumburg, Ill.

[21] Appl. No.: 803,808

[22] Filed: Dec. 9, 1991

[30] Foreign Application Priority Data

Dec. 20, 1990 [FR] France .................. 9016040

[51] Int. Cl.$^5$ .......................... H01L 21/326
[52] U.S. Cl. ..................... 437/174; 437/934; 148/DIG. 71
[58] Field of Search ........... 437/16, 17, 18, 24, 437/173, 174, 930, 934, 935; 148/DIG. 3, DIG. 45, DIG. 46, DIG. 71

[56] References Cited

U.S. PATENT DOCUMENTS

| | | | |
|---|---|---|---|
| 4,273,950 | 6/1981 | Chitre | 437/16 |
| 4,303,455 | 12/1981 | Splinter et al. | 437/174 |
| 4,490,183 | 12/1984 | Scovell | 437/174 |
| 4,593,168 | 6/1986 | Amada | 437/174 |

Primary Examiner—Brian E. Hearn
Assistant Examiner—C. Chaudhari
Attorney, Agent, or Firm—Harry A. Wolin

[57] ABSTRACT

A method of processing a semiconductor device in which a microwave field is generated to surround the semiconductor device while a focussed electron beam or ion beam is applied to the substrate of the device whereby the presence of the electron or ion beam creates a conductive region which increases the microwave field intensity in that region, so that the intensified microwave field creates a local heating effect in the substrate to perform a local annealing action.

7 Claims, 2 Drawing Sheets

*MICROWAVES - ELECTRON BEAM INTERACTION MECHANISM*

FIG.1 EXPERIMENTAL SET UP

MICROWAVES - ELECTRON BEAM INTERACTION MECHANISM

MICROWAVES - ELECTRON BEAM INTERACTION MECHANISM

THERMAL ANNEALING OF SEMICONDUCTOR DEVICES

FIELD OF THE INVENTION

This invention relates to the processing of integrated circuits and other semiconductor devices and more specifically to the thermal annealing of such devices.

BACKGROUND ART

The processing of an integrated circuit chip or wafer normally includes the steps of:
1. Selective polymerisation of a photo sensitive layer using an electron beam (direct writing on wafer).
2. Opening doping windows using the polymerized layer as a mask and etching away an insulating layer ($Sio_2$, $Si_3N_4$, etc. . . . )
3. Doping selected areas of the semiconductor using ion implantation or solid state diffusion (the so called predeposition step).
4. Bringing the dopant ions to substitutional sites (electrical activation of the dopant) using thermal annealing. This involves a non localized heat treatment of the whole substrate material (wafer) in a diffusion furnace or a rapid thermal annealer (RTA).

If selective oxidation is required, an oxygen beam is employed in step 3, and then heat treatment in step 4 creates covalent bonding of the oxygen ions.

A disadvantage of the above process is that the annealing stage is time consuming and can create problems, such as warping of the wafer.

SUMMARY OF THE INVENTION

It is an object of the invention to provide a method for processing a wafer, integrated circuit or other semiconductor device which avoids the need for annealing treatment of the entire substrate.

In accordance with the invention, a microwave field is generated to surround the semiconductor device while a focussed electron beam or ion beam is applied to the substrate whereby the presence of the electron or ion beam creates a conductive region which increases the microwave field intensity in that region, so that the intensified microwave field creates a local heating effect in the substrate to perform a local annealing action.

Thus in accordance with the invention, the requirement for a subsequent annealing effect is avoided since the annealing takes place simultaneously with ion implantation.

So far as concerns the application of an ion beam to the substrate, a beam of arsenic, boron or phosphorus ions may be used for selective implantation. Alternatively a beam of oxygen ions may be employed for selective oxidation of the substrate, the local annealing action assisting in the creation of the covalent bonding.

In the situation where an electron beam is employed for direct writing on the substrate, the local annealing effect may be used to advantage where for example the writing is taking place on a layer of a silicon glass, for example doped with phosphorus or boron. The annealing effect may cause migration of the dopant ions into the region where the electron beam strikes the substrate. This thus avoids the need for masking and selective polymerisation of the substrate in order to predefine regions for ion implantation.

The physical mechanism for achieving an increased intensity of microwave field is linked to the presence of free electrons, either by provision of an electron beam, or through the presence of a "cloud" of secondary electrons surrounding the site of ion beam implantation. This provides an increase in electrical conductivity of the region to effectively increase the electromagnetic permeability or susceptibility of the region.

It has been found the annealing effect occurs for a wide range of ion beam concentration, between $10^{+12}$–$10^{+13}$ and $10^{+16}$ ions $cm^{-3}$. It has been found there is a minimum threshold ion beam concentration, below which threshold the local annealing effect will not occur. The threshold will be dependent on various factors such as the ion type and may easily be found by experiment for any particular application; however a typical value for a threshold is a minimum energy flow of 30–40 watts $cm^{-2}$.

The range of Microwave frequencies which is desirable in the present invention is between 2–4 GHz. Lower frequencies extending down to UHF may not produce an adequate heating effect and higher frequencies may not produce an adequate heating effect and/or be difficult to produce.

Thus in the present invention, local heating result from the coupling of two physical effects: 1. direct interaction of a focused beam with the semiconductor material which produces a very high density of free electrons.; and 2. the selective coupling of high power microwaves with a free electron cloud.

The requirement for a submicronic spot to provide high resolution will not allow thermal annealing by using only an electron beam. This is due to a physical limitation between beam intensity and beam size (space charge effect); the present invention creates optimal energy required to anneal locally using an electron beam assisted by microwaves.

The present invention provides the following advantages:
- maskless operation with in situ annealing
- low bulk temperature operation eliminating dopant profile redistribution (from a prior doping step)
- opens the way to a low cost multilayered device technology (stacked transistors)

BRIEF DESCRIPTION OF THE DRAWINGS

A preferred embodiment of this invention will now be described with reference to the accompanying drawings wherein.

DESCRIPTION OF THE PREFERRED EMBODIMENT

The major interest in the use of microwaves as compared to other sources of energy is that the energy can be confined in a small volume where electron hole pairs are created by an incident electron stream. The physics of the phenomenon is based on the huge and localized material conductivity increase subsequent to the creation of a free electron cloud by a highly focused electron or ion beam.

Figure 2:
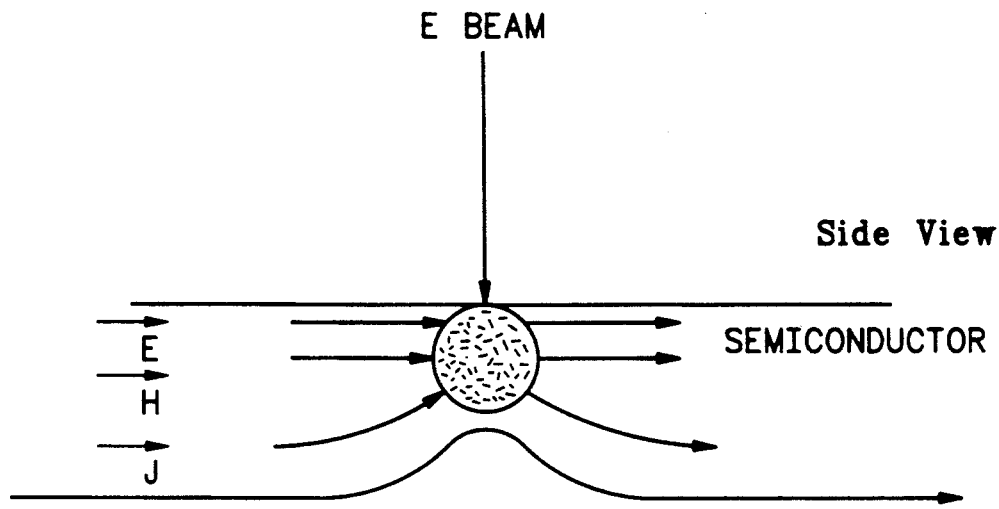
FIG. 2 illustrates a side view of the interaction mechanism of microwaves with an electron beam in the method of the invention.
Figure 3:
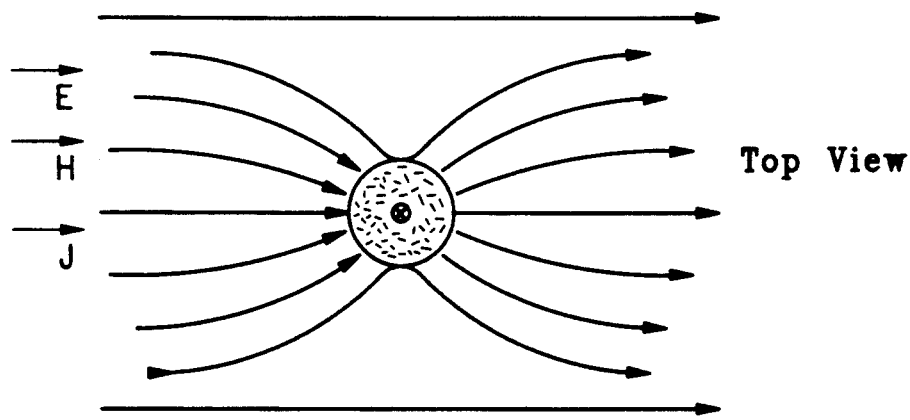
FIG. 3 illustrates a top view of the interaction mechanism of microwaves with an electron beam in the method of the invention.

The energy of the incident electron stream can be considered negligible as compared to the applied microwave energy. The local conductivity enhancement focusses the microwave flux lines as shown in FIG. 2 and FIG. 3.

The accelerating voltage will define the hot spot volume, the scanning speed will control the spot size, the beam intensity and the microwave incident power will determine the hot spot temperature.

The capabilities of the current set up allows a temperature to be reached so that the vaporization of the submicronic areas of semiconductor material can be controlled.

The highly controllable microwave power enables a very good control of the temperature of the substrate. This will allow a standard RTA post treatment if needed to eliminate recrystallisation defects.

Figure 1:
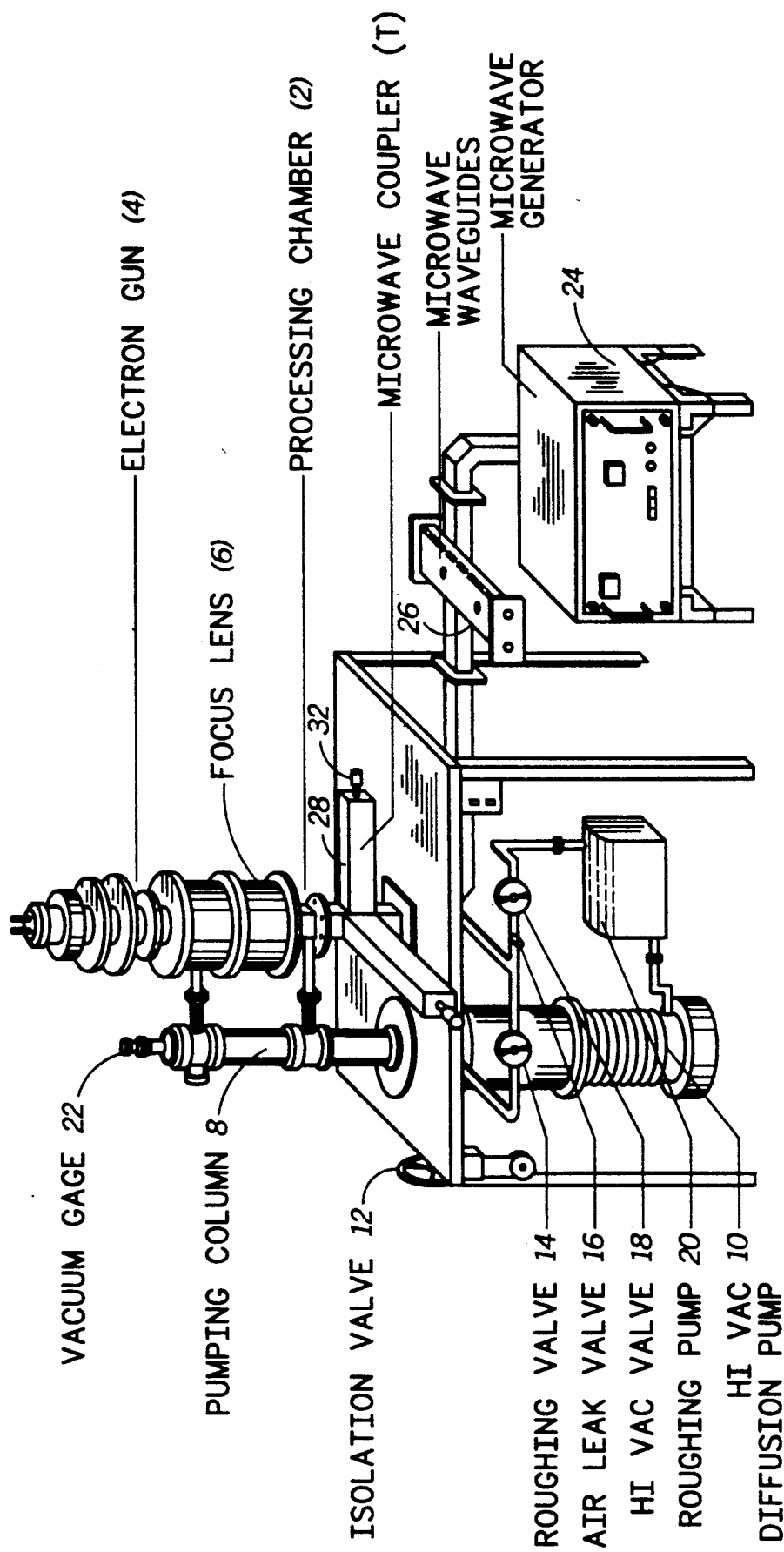
FIG. 1 illustrates apparatus for carrying out the method of the invention.

Referring now to FIG. 1, the apparatus comprises a scanning electron microscope having a processing chamber (2) which contains a holder for a silicon wafer (not shown) Chamber (2) is coupled to an electron gun arrangement of a scanning electron microscope (4) having a focus lens (6) disposed above chamber (2). The microscope includes a high voltage power supply, filament heater, and wehnelt bias power supply. A vacuum arrangement is coupled to the electron gun comprising a pumping column (8) and a diffusion pump (10). Also provided is an isolation valve (12), a roughing valve (14), an air leak valve (16), a high vacuum valve (18) and a roughing pump (20). A vacuum gauge (22) is also provided. A video signal processor and CRT are also provided (not shown).

Microwaves are applied to the processing chamber from a microwave generator (24), providing signals in the region 2–4 GHz, via a quarter wave guide arrangement (26) which is coupled by way of a coupler arrangement (28), which includes tuning elements (30) to the processing chamber in known manner.

In one example the following conditions were employed:

| E Beam: | |
|---|---|
| Size | $50^{-1}$ Micrometer |
| Voltage | .30K Volt |
| Intensity | $10^{-8}$ Ampere |
| Scan Speed | 2.5 Centimeter/Second |
| Microwave | |
| Power | 30 Watt |
| Frequency | 2.45 GHertz |

The present invention may be employed in other applications, for example a) liquid phase diffusion. The diffusion coefficient in liquid phase is 10 times greater than in solid state. With the present invention the diffusion time is drastically reduced to the point that it can be considered as an instant anneal compared to the beam scan speed.

b) oxidation induced by microwave assisted focused beam: The chemical reaction of an oxidizing agent with the substrate in conjunction the Microwave Assisted Focused Beam will produce a localized oxidation. As previously described the control of the focused beam will lead to submicronic oxidation direct writing (e.g. Submicronics Locos).

c) Quenching: The application of the technique will lead to a far superior quenching quality as compared to laser and electron techniques. The reason for this is the solid-liquid temperature gradient is very significantly reduced due to heating effect of the microwave energy in the vicinity of the liquid drop.

d) RTA capability: the technique according to the invention can be used as an Isothermal Rapid Thermal Anneal with the advantages of reaching higher temperatures because the technique can be performed under vacuum, anneal time may be reduced, cleanliness and flexibility.

We claim:

1. A method of processing a semiconductor device comprising the steps of:
   generating a microwave field;
   generating an electron or ion beam; and
   applying the microwave field to surround a semiconductor device substrate and while said microwave field is applied, focusing said electron or ion beam on a portion of said semiconductor device substrate whereby the presence of the electron or ion beam creates a conductive region which increases the microwave field intensity in said region so that the intensified microwave field creates a local heating effect in said semiconductor device substrate to perform a local annealing action.

2. A method according to claim 1 wherein the semiconductor device comprises a wafer having integrated circuits thereon.

3. A method according to claim 1 wherein the ion beam comprises a beam of arsenic boron or phosphorus ions for doping the substrate.

4. A method according to claim 1 wherein the ion beam comprises a beam of oxygen ions for oxidising the substrate.

5. A method according to claim 1 wherein the electron beam is employed for direct writing on a doped layer of material whereby to cause ion migration to locally heated regions.

6. A method according to claim 1 wherein the ion beam concentration is between $10^{+12}$ and $10^{+16}$ ions cm$^{-3}$.

7. A method according to claim 1 wherein the frequency of the microwaves is between 2 and 4 GHz.

* * * * *